US010806016B2

(12) United States Patent
Khodykin et al.

(10) Patent No.: US 10,806,016 B2
(45) Date of Patent: Oct. 13, 2020

(54) HIGH POWER BROADBAND ILLUMINATION SOURCE

(71) Applicant: KLA-Tencor Corporation, Milpitas, CA (US)

(72) Inventors: Oleg Khodykin, San Diego, CA (US); Ilya Bezel, Mountain View, CA (US)

(73) Assignee: KLA Corporation, Milpitas, CA (US)

( * ) Notice: Subject to any disclaimer, the term of this patent is extended or adjusted under 35 U.S.C. 154(b) by 106 days.

(21) Appl. No.: 16/036,660

(22) Filed: Jul. 16, 2018

(65) Prior Publication Data

US 2019/0037676 A1      Jan. 31, 2019

Related U.S. Application Data

(60) Provisional application No. 62/536,914, filed on Jul. 25, 2017.

(51) Int. Cl.
| | |
|---|---|
| *H05G 2/00* | (2006.01) |
| *G21K 1/06* | (2006.01) |
| *G21K 5/04* | (2006.01) |
| *G03F 7/20* | (2006.01) |
| *G01N 21/88* | (2006.01) |
| *H01J 61/00* | (2006.01) |
| *G01N 21/956* | (2006.01) |

(52) U.S. Cl.
CPC .......... *H05G 2/008* (2013.01); *G01N 21/8806* (2013.01); *G03F 7/70008* (2013.01); *G21K 1/06* (2013.01); *G21K 5/04* (2013.01); *H01J 61/00* (2013.01); *G01N 21/956* (2013.01)

(58) Field of Classification Search
CPC ............ H05G 2/008; G21K 5/04; G21K 1/06; G01N 21/956; G01N 21/8806; G03F 7/70008; H01J 61/00

USPC ......................................................... 250/372
See application file for complete search history.

(56) References Cited

U.S. PATENT DOCUMENTS

| | | | | |
|---|---|---|---|---|
| 4,664,769 | A | * | 5/1987 | Cuomo ............ H01J 37/32321 204/192.1 |
| 5,608,526 | A | | 3/1997 | Piwonka-Corle et al. |
| 5,999,310 | A | | 12/1999 | Shafer et al. |

(Continued)

FOREIGN PATENT DOCUMENTS

| | | |
|---|---|---|
| WO | 2015142677 A1 | 9/2015 |
| WO | 2016164372 A1 | 10/2016 |
| WO | 2017084872 A1 | 5/2017 |

OTHER PUBLICATIONS

International Search Report and Written Opinion dated Nov. 6, 2018 for PCT/US2018/043348.

*Primary Examiner* — David P Porta
*Assistant Examiner* — Gisselle M Gutierrez
(74) *Attorney, Agent, or Firm* — Suiter Swantz pc llo

(57) ABSTRACT

A system for generating broadband radiation is disclosed. The system includes a target material source configured to deliver one or more of a liquid or solid state target material to a plasma-forming region of a chamber. The system further includes a pump source configured to generate pump radiation to excite the target material in the plasma forming region of the chamber to generate broadband radiation. The system is further configured to transmit at least a portion of the broadband radiation generated in the plasma-forming region of the chamber out of the chamber through a windowless aperture.

44 Claims, 5 Drawing Sheets

(56) References Cited

U.S. PATENT DOCUMENTS

| | | | |
|---|---|---|---|
| 6,297,880 B1 | 10/2001 | Rosencwaig et al. | |
| 7,525,649 B1 | 4/2009 | Leong et al. | |
| 8,212,228 B2 * | 7/2012 | Abe | G03F 7/70033 |
| | | | 250/493.1 |
| 8,618,254 B2 | 12/2013 | Giaccia et al. | |
| 2006/0176925 A1 * | 8/2006 | Nakano | H05G 2/003 |
| | | | 372/69 |
| 2006/0284101 A1 * | 12/2006 | Peskov | G01N 21/33 |
| | | | 250/373 |
| 2007/0002465 A1 | 1/2007 | Chuang et al. | |
| 2009/0180176 A1 | 7/2009 | Armstrong et al. | |
| 2011/0266468 A1 * | 11/2011 | Nagai | G03F 7/70033 |
| | | | 250/504 R |
| 2012/0228527 A1 * | 9/2012 | Abe | G03F 7/70033 |
| | | | 250/504 R |
| 2013/0114085 A1 | 5/2013 | Wang et al. | |
| 2015/0043599 A1 * | 2/2015 | Yanagida | H01S 3/1106 |
| | | | 372/18 |
| 2015/0048741 A1 | 2/2015 | Shortt et al. | |
| 2015/0049778 A1 * | 2/2015 | Shchemelinin | G02B 27/1006 |
| | | | 372/76 |
| 2016/0249442 A1 * | 8/2016 | Kuritsyn | H05G 2/003 |
| 2016/0268120 A1 * | 9/2016 | Bezel | H01J 65/04 |

* cited by examiner

HIGH POWER BROADBAND ILLUMINATION SOURCE

PRIORITY

The present application claims priority to U.S. Provisional Application Ser. No. 62/536,914, filed Jul. 25, 2017, entitled HIGH POWER HIGH BRIGHTNESS VUV AND DUV BROADBAND CW AND MODULATED SOURCE AND METHOD OF PRODUCING THEREOF, naming Oleg Khodykin and Ilya Bezel as inventors, which is incorporated herein by reference in the entirety.

TECHNICAL FIELD

The present invention generally relates to plasma-based radiation sources, and, more particularly, to laser sustained plasma (LSP) broadband radiation sources including a plasma generated near atmospheric pressure.

BACKGROUND

As the demand for integrated circuits having ever-smaller device features continues to increase, the need for improved illumination sources used for inspection of these ever-shrinking devices continues to grow. One such illumination source includes a laser-sustained plasma (LSP) radiation source. Laser-sustained plasma light sources are capable of producing high-power broadband light. Laser-sustained plasma light sources operate by focusing laser radiation into a gas volume in order to excite the gas, such as argon or xenon, into a plasma state, which is capable of emitting light. This effect is typically referred to as "pumping" the plasma. In current applications, a relatively high density of plasma is needed and is achieved by providing high pressure (30-200 atm) to a target gas.

The transmissive elements in an LSP radiation source experience high pressure and temperature due to the target gas within the chamber housing the plasma. Transmissive windows, often made of materials such as calcium fluoride, magnesium fluoride, or lithium fluoride, also transmit radiation below 190 nm that is generated by the plasma. The combination of high pressure, high temperature and radiation below 190 nm make the lifetime of transmissive optics used in LSP radiation sources very short.

Therefore, it would be desirable to provide a system and method that cure one or more shortfalls of the previous approaches identified above.

SUMMARY

An apparatus is disclosed, in accordance with one or more embodiments of the present disclosure. In one embodiment, the apparatus includes a chamber. In another embodiment, the chamber is configured to contain a volume of buffer gas. In another embodiment, the apparatus includes a target material source positioned on a first side of the chamber. In another embodiment, the apparatus includes a debris collector. In another embodiment, the apparatus includes a debris collector positioned on a second side of the chamber opposite the target material source. In another embodiment, the target material source is configured to deliver a stream of target material through a plasma-forming region of the chamber. In another embodiment, the debris collector is configured to collect target material. In another embodiment, the apparatus includes a pump source. In another embodiment, the apparatus includes a pump source configured to deliver pump radiation to the plasma-forming region of the chamber. In another embodiment, the pump radiation from the pump source is sufficient to generate broadband radiation via formation of a plasma by excitation of the target material within the plasma-forming region of the chamber. In another embodiment, the apparatus includes one or more focusing optical elements. In another embodiment, the one or more focusing optical elements are configured to focus the pump radiation into the plasma-forming region. In another embodiment, the apparatus includes one or more reflective collection optical elements. In another embodiment, the one or more reflective collection optical elements are configured to collect a portion of the broadband radiation from the plasma and deliver the portion of the broadband radiation to one or more optical elements external to the chamber through an aperture in a wall of the chamber.

A system is disclosed, in accordance with one or more embodiments of the present disclosure. In one embodiment, the system includes a broadband source. In another embodiment, the broadband source includes a chamber configured to contain a volume of inert gas. In another embodiment, the broadband source includes a target material source positioned on a first side of the chamber. In another embodiment, the broadband source includes a debris collector positioned on a second side of the chamber opposite the target material source. In another embodiment, the target material source is configured to deliver a stream of target material through a plasma-forming region of the chamber. In another embodiment, the debris collector is configured to collect target material. In another embodiment, the broadband source includes a pump source. In another embodiment, the pump source is configured to deliver pump radiation to the plasma-forming region of the chamber. In another embodiment, the pump radiation from the pump source is sufficient to generate broadband radiation via formation of a plasma by excitation of the target material within the plasma-forming region of the chamber. In another embodiment, the broadband source includes one or more focusing optical elements. In another embodiment, the one or more focusing optical elements are configured to focus the pump radiation into the plasma-forming region. In another embodiment, the broadband source includes one or more reflective collection optical elements. In another embodiment, the one or more reflective collection optical elements are configured to collect a portion of the broadband radiation from the plasma and deliver the portion of the broadband radiation to one or more optical elements external to the chamber through an aperture in a wall of the chamber. In another embodiment, the broadband source includes a set of illuminator optics. In another embodiment, the set of illuminator optics are configured to direct the broadband radiation from the one or more reflective collection optics to one or more specimens. In another embodiment, the broadband source includes a detector. In another embodiment, the broadband source includes a set of projection optics. In another embodiment, the set of projection optics are configured to receive illumination from the surface of the one or more specimens and direct the illumination from the one or more specimens to the detector.

A method is disclosed, in accordance with one or more embodiments of the present disclosure. In one embodiment, the method includes delivering a stream of target material through a plasma-forming region of a gas chamber. In another embodiment, the method includes collecting debris from the plasma-forming region. In another embodiment, the method includes generating pump radiation. In another embodiment, the method includes focusing the pump radiation into the plasma-forming region of the chamber to generate broadband radiation via formation of a plasma by excitation of the target material within the plasma-forming region of the chamber. In another embodiment, the method includes collecting a portion of the broadband radiation from the plasma and delivering the portion of the broadband radiation to one or more optical elements external to the chamber through a windowless aperture in a wall of the chamber.

BRIEF DESCRIPTION OF THE DRAWINGS

The numerous advantages of the disclosure may be better understood by those skilled in the art by reference to the accompanying figures in which.

DETAILED DESCRIPTION

Figure 1:
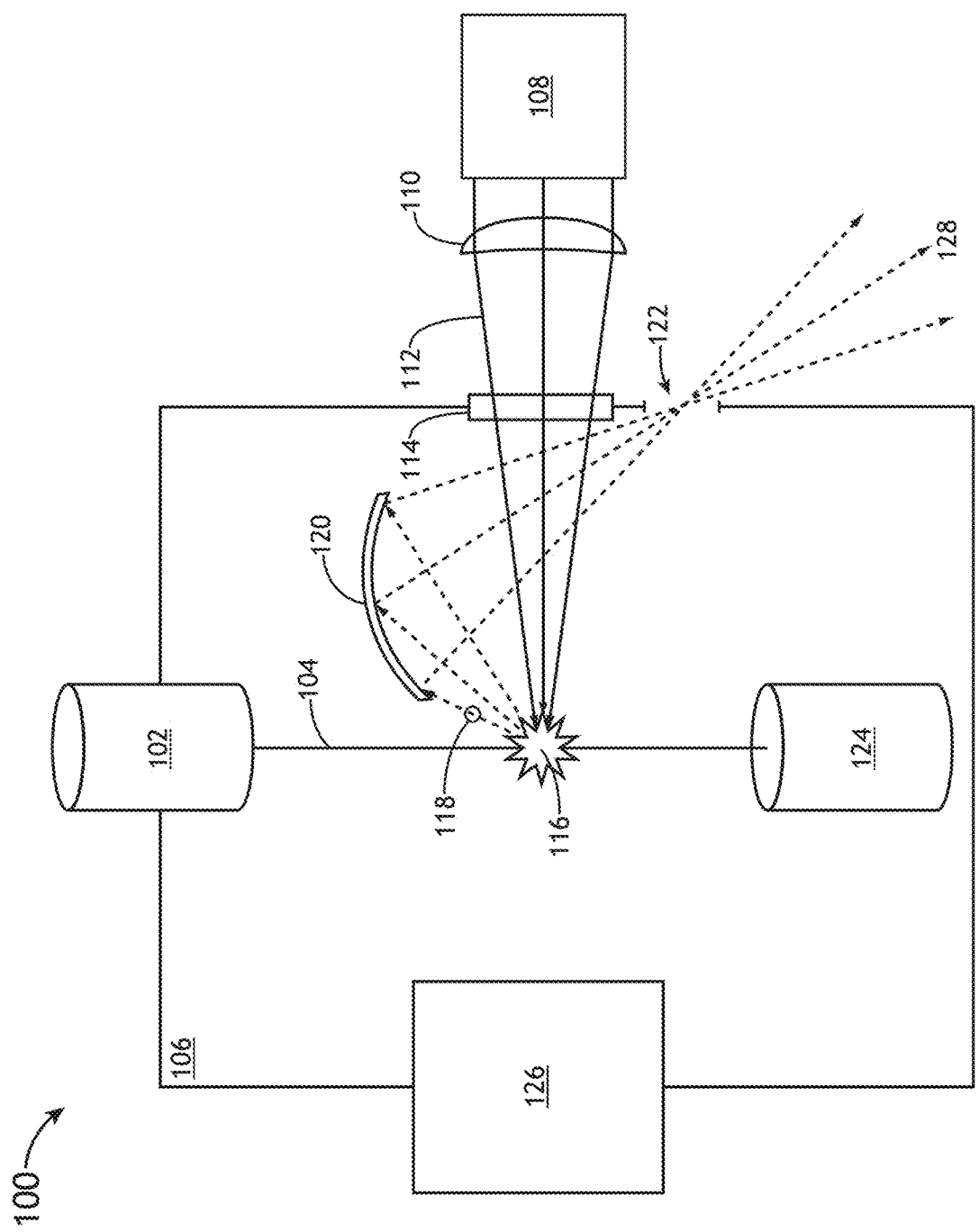
FIG. 1 illustrates a simplified schematic view of a laser sustained plasma (LSP) broadband radiation source, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

The present disclosure generally relates to a laser-sustained plasma (LSP) radiation source. The LSP includes a material source that provides one or more target materials (e.g., argon, xenon, neon, or helium) in a non-gaseous form for laser excitation. For example, the LSP may provide target material in the form of at least a liquid, a solid or a combination of a liquid and a solid. For instance, target material provided by the material source may be provided by one or more of a jet, a stream, a slurry, a mist, a spray, a droplet, a bead, a grain, a particle, or another other non-gaseous form of material. The plasma generated by the LSP emits broadband radiation that is directed by reflective collection optics out of the LSP through a windowless aperture. It is noted herein that an advantage of the present disclosure is the utilization of reflective optics that eliminate the need for transmissive windows. It is noted herein that a further advantage of the present disclosure is that delivery of a high density target material in the form of a solid, a liquid, or a combination of a solid and liquid eliminates the need for a high pressure gas chamber.

Reference will now be made in detail to the subject matter disclosed, which is illustrated in the accompanying drawings.

Referring generally to FIGS. 1-5, systems and methods for generating improved laser-sustained plasma (LSP) radiation sources are described, in accordance with one or more embodiments of the present disclosure. Embodiments of the present disclosure are directed to the delivery of target material in the form of a liquid jet, liquid droplets, a frozen jet, frozen droplets, a slurry, a stream or a combination of these target material forms. Additional embodiments of the present disclosure are directed to a liquid jet of 10-2000 microns in diameter and/or droplets of about 10-300 m/s speed. Additional embodiments of the present disclosure are directed to delivery of the target material at or near atmospheric pressure (e.g., 0.1-2 atm). Additional embodiments of the present disclosure utilize reflective collection optics to transmit broadband radiation from the LSP radiation source through a windowless aperture. It is noted herein that enhanced, fast-flow of the target material within the chamber may promote stable plasma 116 generation. Additional embodiments of the present disclosure collect broadband radiation, such as, but not limited to, VUV and/or DUV radiation with high numerical aperture (NA) (e.g., about $\pi$ srad) broadband reflective optics. It is further noted herein, that in order for an LSP radiation source to have significant brightness in DUV and/or VUV, a relatively high density of the plasma is needed. For example, density of an LSP radiation source should be sufficiently high so as to absorb the pump laser beam and also sufficiently dense to provide sufficient emissivity in DUV and/or VUV and other spectral regions. Embodiments of the present disclosure deliver the working gas at high density to the plasma in form of liquid or solid jet.

FIG. 1 illustrates a simplified schematic view of a broadband LSP radiation source 100, in accordance with one or more embodiments of the present disclosure. In one embodiment, the LSP radiation source 100 includes a target material source 102, a pump source 108, pump laser focusing optics 110, and a set of collection optics 120. In another embodiment, the LSP radiation source 100 includes a debris collector 124. It is noted that the LSP radiation source 100 may generate broadband radiation 118 of any wavelength range including, but not limited to, vacuum ultraviolet (VUV) (e.g., 100-190 nm) and/or deep ultraviolet (DUV) (e.g., 190-260 nm).

In one embodiment, the target material source 102 delivers one or more target materials 104 into the chamber 106. For example, the target material source 102 may introduce one or more target materials 104 into the chamber 106 in the form of a liquid jet, liquid droplets, a frozen jet, frozen droplets, or a combination of these target material forms. In another embodiment, the stream delivery parameters of target material 104 from the target material source 102 are adjusted such that either all material delivered by the target material source 102 evaporates in the plasma region or some of the material passes through the plasma and is collected by the debris collector 124. In another embodiment, the debris collector 124 is positioned on a side of the chamber opposite the target material source 102. It is noted herein that adjustment of stream delivery parameters may promote stable plasma 116 generation and generate broadband radiation 118 with one or more substantially constant properties.

The target material source 102 may deliver any type of target material known in the art of LSP broadband sources. For example, the target material may include, but is not limited to, Ar, Xe, Ne, and He or mixtures of Ar, Xe, Ne, and He.

In one embodiment, the pump source 108 is configured to generate a pump beam 112 (e.g., laser radiation) focused by pump laser focusing optics 110. In another embodiment, the pump source 108 includes any radiation source known in the art including, but not limited to, one or more lasers. In another embodiment, the pump beam 112 includes radiation of any wavelength or wavelength range known in the art including, but not limited to, infrared (IR) radiation, near infrared (NIR) radiation, ultraviolet (UV) radiation, visible radiation, or other radiation suitable to form a plasma when incident on a suitable target material.

In one embodiment, the pump laser focusing optics 110 focus the pump beam 112 through a pump laser window 114 into the chamber 106. In another embodiment, the pump laser focusing optics 110 focus the pump beam 112 into one or more target materials 104 so as to generate and/or sustain a plasma 116. In another embodiment, target material 104 is evaporated and ionized by the pump beam 112 providing a high local concentration of plasma in the chamber. In another embodiment, the pressure of heated material ejected from the plasma will rapidly decrease from the plasma region outward. It is noted herein that the pump laser focusing optics 110 may include any optical element known in the art for directing and/or focusing radiation including, but not limited to, a lens, a mirror, a prism, a polarizer, a grating, a filter, or a beamsplitter.

The focusing of the pump beam 112 into the target material 104 causes energy to be absorbed through one or more absorption lines of the target material and/or plasma 116 contained within chamber 106, thereby "pumping" the one or more target material 104 in order to generate and/or sustain the plasma 116. For example, the pump laser focusing optics 110 may generate and/or sustain a plasma 116 by focusing the pump beam 112 to one or more focal points within the one or more target materials 104 contained within the chamber 106 in order to generate and/or sustain a plasma 116. It is noted herein that the LSP radiation source 100 may include one or more additional ignition sources used to facilitate the generation of the plasma 116 without departing from the spirit or scope of the present disclosure. For example, the chamber 106 may include one or more electrodes which may initiate and/or maintain the plasma 116.

In one embodiment, the broadband radiation 118 generated by the plasma 116 exits the chamber 106 through one or more apertures 122. For example, the collection optics 120 may be arranged so as to collect broadband radiation 118 from the plasma 116 and, in turn, direct at least a portion of the collected broadband plasma through the one or more apertures 122. In another embodiment, the one or more apertures 122 are windowless and located in the wall of the chamber 106. For example, the one or more apertures 122 may include, but are not limited to, a hole, a port, an outlet, a vent, a space or any other opening allowing the broadband radiation 118 to exit the chamber 106 through the wall of the chamber 106 without being transmitted through a material other than ambient atmosphere.

In one embodiment, the chamber 106 is fluidically coupled to a vacuum pump 126. In another embodiment, the pressure in the chamber 106 is maintained about 1 atm. For example, the pressure in the chamber 106 may be kept in a range of 0.1-2 atm. For instance, the vacuum pump 126 may remove gas (e.g., gas ejected from the plasma, buffer gas) from the chamber 106 to maintain a pressure in a range of 0.1-2 atm in the chamber 106.

In one embodiment, the set of collection optics 120 include one or more optical elements known in the art configured to collect radiation (e.g., broadband radiation 118) including, but not limited to, one or more mirrors, one or more prisms, one or more lenses, one or more diffractive optical elements, one or more parabolic mirrors, one or more elliptical mirrors, and the like. It is noted herein that the set of collection optics 120 may be configured to collect and/or focus broadband radiation 118 generated by plasma 116 to be used for one or more down-stream processes including, but not limited to, imaging processes, inspection processes, metrology processes, lithography processes, and the like. In another embodiment, the set of collection optics 120 are protected from damage by being positioned at a sufficient distance from the plasma 116. For example, the set of collection optics 120 may be positioned in a range of 5-100 cm from the plasma so as not to be damaged by the plasma 116.

In one embodiment, the pump laser focusing optics 110 and the collection optics 120 are physically separated. It is noted that physical separation of the pump laser focusing optics 110 and the collection optics 120 eliminate the need for cold mirror and/or dual bandwidth reflective elliptical optics.

In one embodiment, the reflective optic surfaces of the collection optics 120 in the chamber 106 are protected by a buffer gas. For example, a buffer gas (e.g., inert gas, same material as the target material, different material from the target material) is maintained in the chamber 106 at about 1 atm.

In one embodiment, the specific geometry of the pump source focusing optics 110 and the collection optics 120 is optimized depending on the laser power and collection etendue requirements. In another embodiment, collection optics 120 direct broadband radiation to a collection location 128.

In one embodiment, the pump source 108 includes one or more radiation sources. For example, the pump source 108 may include any laser system known in the art. For instance, the pump source 108 may include any laser system known in the art capable of emitting radiation in the infrared, visible and/or ultraviolet portions of the electromagnetic spectrum. In another embodiment, the pump source 108 includes a laser system configured to emit continuous wave (CW) laser radiation. For example, the pump source 108 may include one or more CW infrared laser sources.

In another embodiment, the pump source 108 includes one or more modulated CW lasers configured to provide modulated laser light to the plasma 116. In another embodiment, the pump source 108 may include one or more pulsed lasers configured to provide pulsed laser light to the plasma 116.

In one embodiment, the pump source 108 may include one or more diode lasers. For example, the pump source 108 may include one or more diode lasers emitting radiation at a wavelength corresponding with any one or more absorption lines of the species of the target material 104 contained within the chamber 106. It is noted that a diode laser of the pump source 108 may be selected for implementation such that the wavelength of the diode laser is tuned to any absorption line of any plasma (e.g., ionic transition line) or any absorption line of the plasma-producing target material (e.g., highly excited neutral transition line) known in the art. As such, the choice of a given diode laser (or set of diode lasers) will depend on the type of target material contained within the chamber 106 of system 100.

In another embodiment, the pump source 108 includes an ion laser. For example, the pump source 108 may include any noble gas ion laser known in the art. For instance, in the case of an argon-based plasma, the pump source 108 used to pump argon ions may include an Ar+ laser.

In another embodiment, the pump source 108 includes one or more frequency converted laser systems. For example, the pump source 108 may include an Nd:YAG or Nd:YLF laser.

In another embodiment, the pump source 108 includes one or more non-laser sources. In a general sense, the pump source 108 may include any non-laser light source known in the art. For instance, the pump source 108 may include any non-laser system known in the art capable of emitting radiation discretely or continuously in the infrared, visible or ultraviolet portions of the electromagnetic spectrum.

In another embodiment, the pump source 108 includes two or more radiation sources. For example, the pump source 108 may include, but is not limited to, two or more lasers. For instance, the pump source 108 (or pump sources) may include multiple diode lasers. In another instance, the pump source 108 may include multiple CW lasers and/or pulsed lasers. In another embodiment, each of two or more lasers may emit laser radiation tuned to a different absorption line of the target material or plasma within the chamber 106 of system 100.

In one embodiment, the pump source 108 generates pump radiation with a pulse spacing of 100-1000 ns. In another embodiment, the pump source 108 operates at a power in the range of 3-100 kW. In another embodiment, the pump source 108 includes a peak laser intensity of greater than 10,000 $W/cm^2$. For example, the pump source 108 may include a peak laser intensity of greater than $10^5$ $W/cm^2$. In another embodiment, ignition of the one or more target material 104 to generate a plasma 116 is performed using a short pulse (e.g., <100 ns) high peak power (>$10^8$ $W/cm^2$) laser.

Figure 2A:
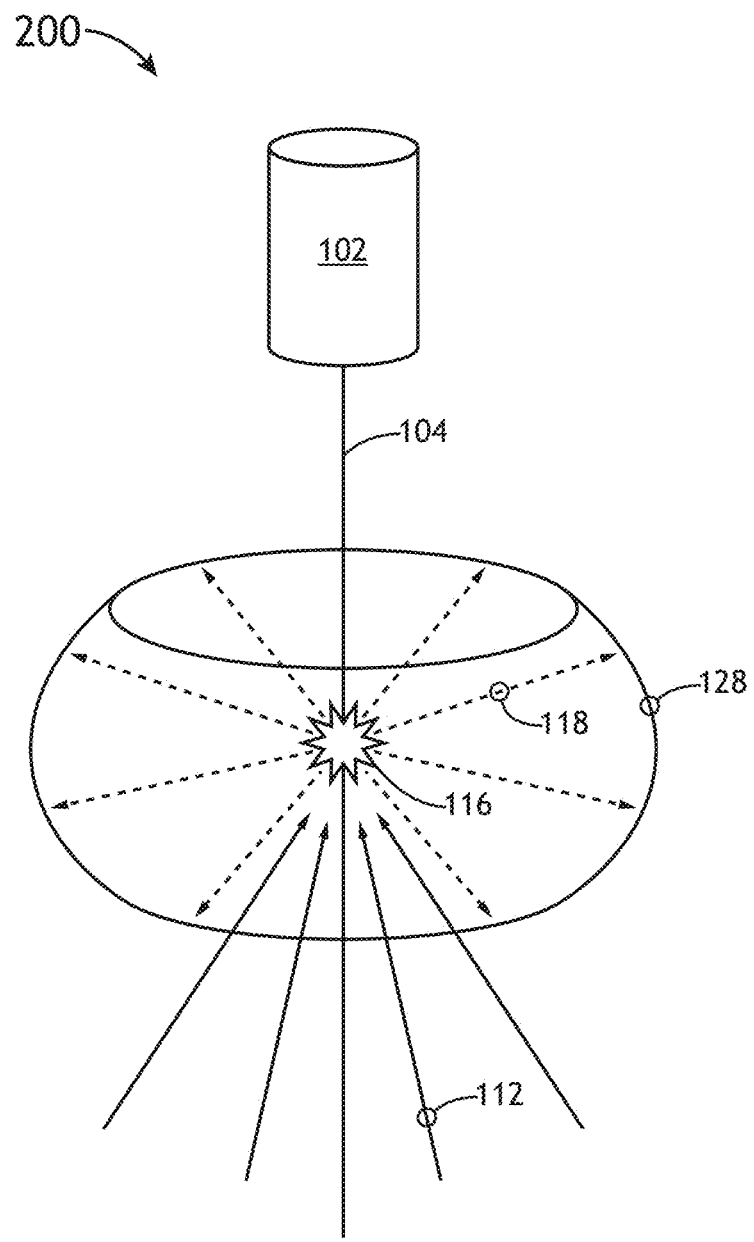
FIG. 2A illustrates a pump and collection configuration including a low NA pump and high NA collection, in accordance with one or more embodiments of the present disclosure.

FIG. 2A illustrates a pump and collection configuration including a low NA pump and high NA collection, in accordance with one or more embodiments of the present disclosure. In one embodiment, the pump source 108, the one or more focusing optical elements 110, and the reflective collection optical elements 120 are arranged such that the broadband radiation 118 has a numerical aperture higher than the NA of the pump radiation 112. In another embodiment, collection optics 120 direct broadband radiation to a collection location 128.

Figure 2B:
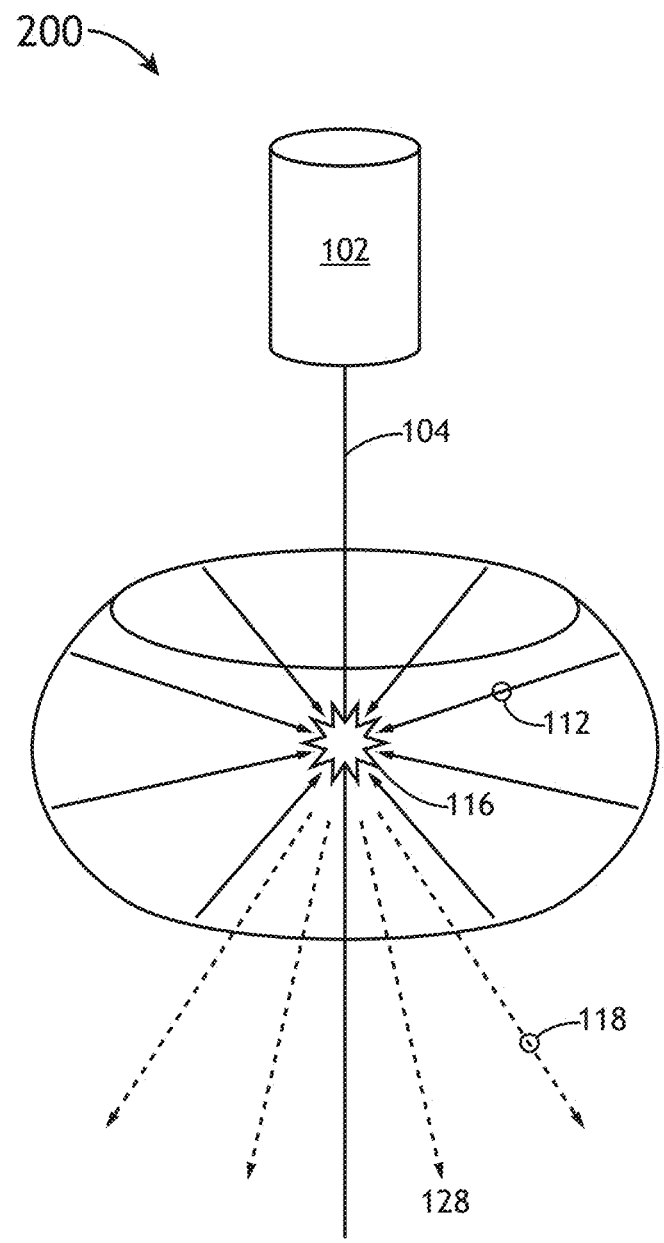
FIG. 2B illustrates a pump and collection configuration including a high NA pump and low NA collection, in accordance with one or more embodiments of the present disclosure.

FIG. 2B illustrates a pump and collection configuration including a high NA pump and low NA collection, in accordance with one or more embodiments of the present disclosure. In one embodiment, the pump source 108, the one or more focusing optical elements 110, and the reflective collection optical elements 120 are arranged such that the broadband radiation 118 has a numerical aperture lower than the NA of the pump radiation. In another embodiment, collection optics 120 direct broadband radiation to a collection location 128.

Figure 3:
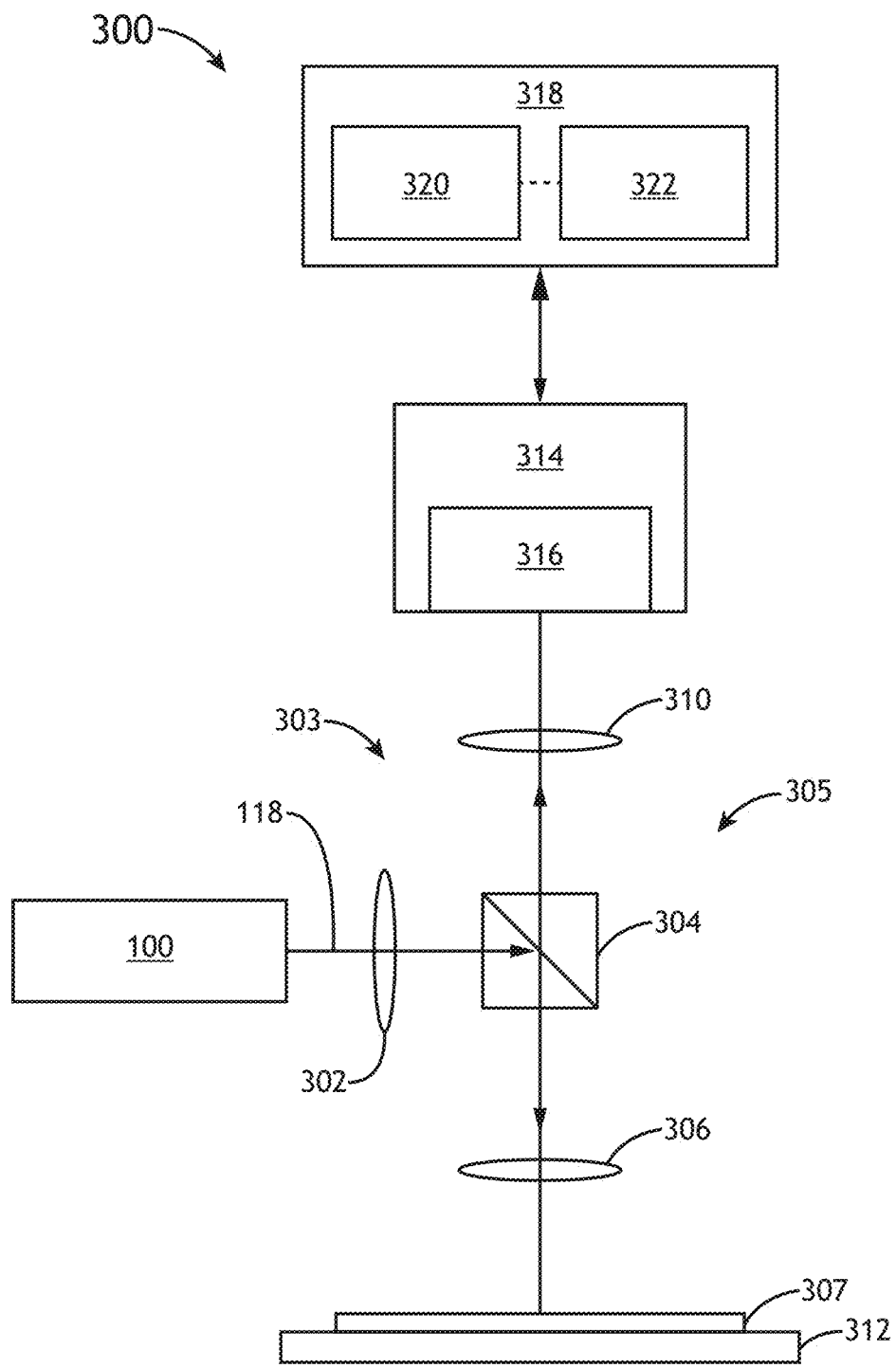
FIG. 3 illustrates a simplified schematic view of an optical characterization system implementing the LSP radiation source, in accordance with one or more embodiments of the present disclosure.

FIG. 3 illustrates a simplified schematic view of an optical characterization system 300 implementing the LSP radiation source 100, in accordance with one or more embodiments of the present disclosure. In one embodiment, system 300 includes the LSP radiation source 100, an illumination arm 303, a collection arm 305, a detector 314, and a controller 318 including one or more processors 320 and memory 322.

It is noted herein that system 300 may comprise any imaging, inspection, metrology, lithography, or other characterization system known in the art. In this regard, system 300 may be configured to perform inspection, optical metrology, lithography, and/or any form of imaging on a specimen 307. Specimen 307 may include any sample known in the art including, but not limited to, a wafer, a reticle, a photomask, and the like. It is noted that system 300 may incorporate one or more of the various embodiments of the LSP radiation source 100 described throughout the present disclosure.

In one embodiment, specimen 307 is disposed on a stage assembly 312 to facilitate movement of specimen 307. Stage assembly 312 may include any stage assembly 312 known in the art including, but not limited to, an X-Y stage, an R-θ stage, and the like. In another embodiment, stage assembly 312 is capable of adjusting the height of specimen 307 during inspection or imaging to maintain focus on the specimen 307.

In one embodiment, the illumination arm 303 is configured to direct broadband radiation 118 from the LSP radiation source 100 to the specimen 307. The illumination arm 303 may include any number and type of optical components known in the art. In one embodiment, the illumination arm 303 includes one or more optical elements 302, a beam splitter 304, and an objective lens 306. In this regard, illumination arm 303 may be configured to focus broadband radiation 118 from the LSP radiation source 100 onto the surface of the specimen 307. The one or more optical elements 302 may include any optical element or combination of optical elements known in the art including, but not limited to, one or more mirrors, one or more lenses, one or more polarizers, one or more gratings, one or more filters, one or more beam splitters, and the like. It is noted herein that the collection location 128 may include, but is not limited to, one or more of the optical elements 302, a beam splitter 304, or an objective lens 306.

In one embodiment, system 300 includes a collection arm 305 configured to collect light reflected, scattered, diffracted, and/or emitted from specimen 307. In another embodiment, collection arm 305 may direct and/or focus the light from the specimen 307 to a sensor 316 of a detector assembly 314. It is noted that sensor 316 and detector assembly 314 may include any sensor and detector assembly known in the art. The sensor 316 may include, but is not limited to, a CCD sensor or a CCD-TDI sensor. Further, sensor 316 may include, but is not limited to, a line sensor or an electron-bombarded line sensor.

In one embodiment, detector assembly 314 is communicatively coupled to a controller 318 including one or more processors 320 and memory 322. For example, the one or more processors 320 may be communicatively coupled to memory 322, wherein the one or more processors 320 are configured to execute a set of program instructions stored on memory 322. In one embodiment, the one or more processors 320 are configured to analyze the output of detector assembly 314. In one embodiment, the set of program instructions are configured to cause the one or more processors 320 to analyze one or more characteristics of specimen 307. In another embodiment, the set of program instructions are configured to cause the one or more processors 320 to modify one or more characteristics of system 300 in order to maintain focus on the specimen 307 and/or the sensor 316. For example, the one or more processors 320 may be configured to adjust the objective lens 306 or one or more optical elements 302 in order to focus broadband radiation 118 from LSP radiation source 100 onto the surface of the specimen 307. By way of another example, the one or more processors 320 may be configured to adjust the objective lens 306 and/or one or more optical elements 310 in order to collect illumination from the surface of the specimen 307 and focus the collected illumination on the sensor 316.

It is noted that the system 300 may be configured in any optical configuration known in the art including, but not limited to, a dark-field configuration, a bright-field orientation, and the like.

It is noted herein that the one or more components of system 100 may be communicatively coupled to the various other components of system 100 in any manner known in the art. For example, the LSP radiation source 100, detector assembly 314, controller 318, and one or more processors 320 may be communicatively coupled to each other and other components via a wireline (e.g., copper wire, fiber optic cable, and the like) or wireless connection (e.g., RF coupling, IR coupling, data network communication (e.g., WiFi, WiMax, Bluetooth and the like).

Additional details of various embodiments of optical characterization system 300 are described in U.S. patent application Ser. No. 13/554,954, entitled "Wafer Inspection System," filed on Jul. 9, 2012; U.S. Published Patent Application 2009/0180176, entitled "Split Field Inspection System Using Small Catadioptric Objectives," published on Jul. 16, 2009; U.S. Published Patent Application 2007/0002465, entitled "Beam Delivery System for Laser Dark-Field Illumination in a Catadioptric Optical System," published on Jan. 4, 2007; U.S. Pat. No. 5,999,310, entitled "Ultrabroadband UV Microscope Imaging System with Wide Range Zoom Capability," issued on Dec. 7, 1999; U.S. Pat. No. 7,525,649 entitled "Surface Inspection System Using Laser Line Illumination with Two Dimensional Imaging," issued on Apr. 28, 2009; U.S. Published Patent Application 2013/0114085, entitled "Dynamically Adjustable Semiconductor Metrology System," by Wang et al. and published on May 9, 2013; U.S. Pat. No. 5,608,526, entitled "Focused Beam Spectroscopic Ellipsometry Method and System, by Piwonka-Corle et al., issued on Mar. 4, 1997; and U.S. Pat. No. 6,297,880, entitled "Apparatus for Analyzing Multi-Layer Thin Film Stacks on Semiconductors," by Rosencwaig et al., issued on Oct. 2, 2001, which are each incorporated herein by reference in their entirety.

The one or more processors 320 of the present disclosure may include any one or more processing elements known in the art. In this sense, the one or more processors 320 may include any microprocessor-type device configured to execute software algorithms and/or instructions. In one embodiment, the one or more processors 320 may consist of a desktop computer, mainframe computer system, workstation, image computer, parallel processor, or other computer system (e.g., networked computer) configured to execute a program configured to operate the system 300 and/or LSP radiation source 100, as described throughout the present disclosure. It should be recognized that the steps described throughout the present disclosure may be carried out by a single computer system or, alternatively, multiple computer systems. In general, the term "processor" may be broadly defined to encompass any device having one or more processing elements, which execute program instructions from a non-transitory memory medium 322. Moreover, different subsystems of the various systems disclosed may include processor or logic elements suitable for carrying out at least a portion of the steps described throughout the present disclosure. Therefore, the above description should not be interpreted as a limitation on the present disclosure but merely an illustration.

The memory medium 322 may include any storage medium known in the art suitable for storing program instructions executable by the associated one or more processors 320. For example, the memory medium 322 may include a non-transitory memory medium. For instance, the memory medium 322 may include, but is not limited to, a read-only memory, a random access memory, a magnetic or optical memory device (e.g., disk), a magnetic tape, a solid state drive, and the like. In another embodiment, the memory 322 is configured to store one or more results and/or outputs of the various steps described herein. It is further noted that memory 322 may be housed in a common controller housing with the one or more processors 320. In an alternative embodiment, the memory 322 may be located remotely with respect to the physical location of the processors 320. For instance, the one or more processors 320 may access a remote memory (e.g., server), accessible through a network (e.g., internet, intranet, and the like). In another embodiment, the memory medium 322 maintains program instructions for causing the one or more processors 320 to carry out the various steps described through the present disclosure.

In one embodiment, the system 300 may include a user interface (not shown). In one embodiment, the user interface is communicatively coupled to the one or more processors 320. In another embodiment, the user interface device may be utilized to accept selections and/or instructions from a user. In some embodiments, described further herein, a display may be used to display data to a user. In turn, a user may input selection and/or instructions (e.g., selection, sizing, and/or position of filter box) responsive to data displayed to the user via the display device.

The user interface device may include any user interface known in the art. For example, the user interface may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel mounted input device, or the like. In the case of a touchscreen interface device, those skilled in the art should recognize that a large number of touchscreen interface devices may be suitable for implementation in the present invention. For instance, the display device may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present disclosure.

The display device may include any display device known in the art. In one embodiment, the display device may include, but is not limited to, a liquid crystal display (LCD), an organic light-emitting diode (OLED) based display or a CRT display. Those skilled in the art should recognize that a variety of display devices may be suitable for implementation in the present disclosure and the particular choice of display device may depend on a variety of factors, including, but not limited to, form factor, cost, and the like. In a general sense, any display device capable of integration with a user interface device (e.g., touchscreen, bezel mounted interface, keyboard, mouse, trackpad, and the like) is suitable for implementation in the present disclosure.

In some embodiments, the LSP radiation source 100 and system 300, as described herein, may be configured as a "stand alone tool" or a tool that is not physically coupled to a process tool. In other embodiments, such an inspection or metrology system may be coupled to a process tool (not shown) by a transmission medium, which may include wired and/or wireless portions. The process tool may include any process tool known in the art such as a lithography tool, an etch tool, a deposition tool, a polishing tool, a plating tool, a cleaning tool, or an ion implantation tool. The results of inspection or measurement performed by the systems described herein may be used to alter a parameter of a process or a process tool using a feedback control technique, a feedforward control technique, and/or an in-situ control technique. The parameter of the process or the process tool may be altered manually or automatically.

The embodiments of the LSP radiation source 100 and system 300 may be further configured as described herein. In addition, the LSP radiation source 100 and system 300 may be configured to perform any other step(s) of any of the method embodiment(s) described herein.

Figure 4:
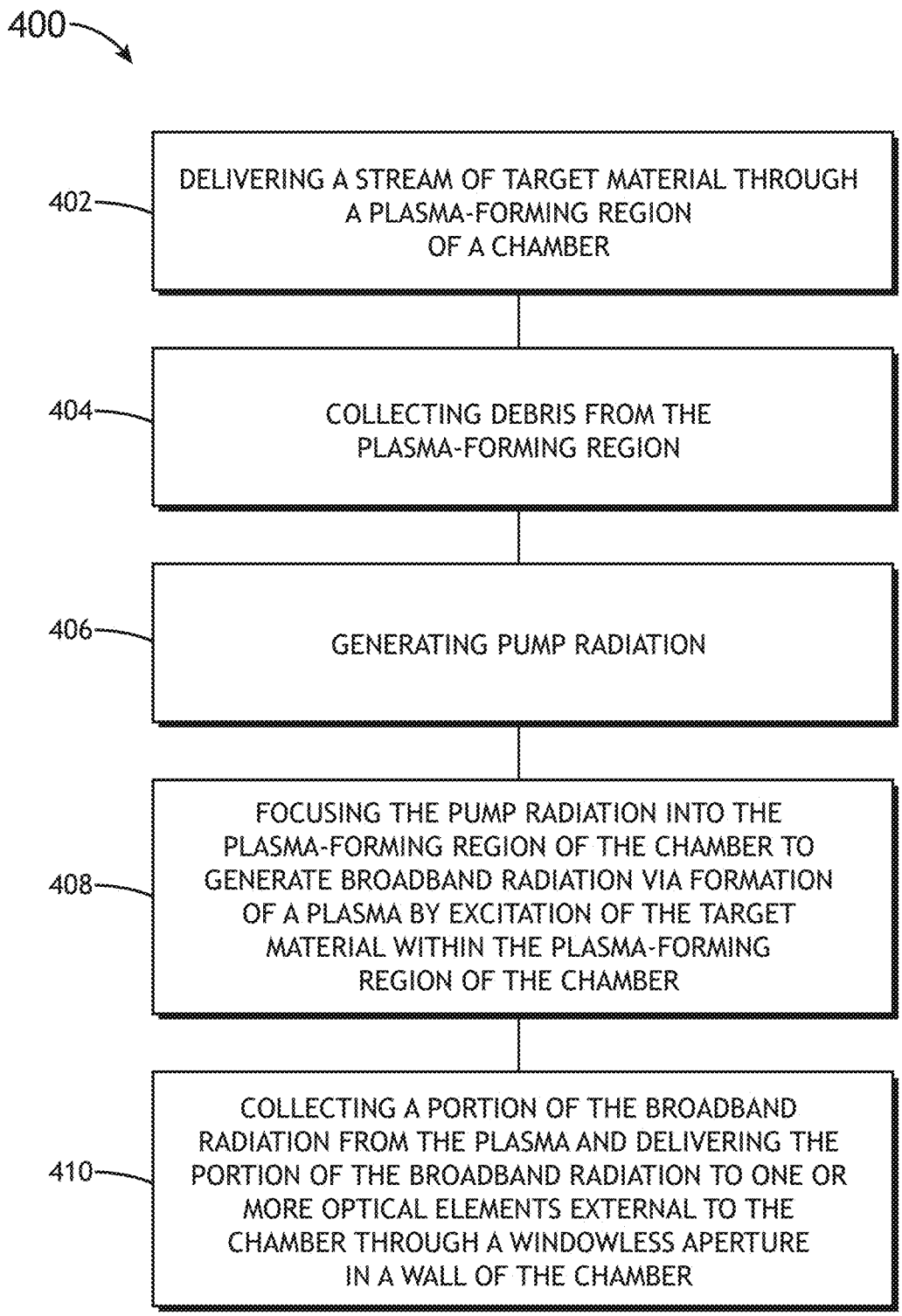
FIG. 4 illustrates a flow diagram depicting a method for generating broadband radiation, in accordance with one or more embodiments of the present disclosure.

FIG. 4 illustrates a flow diagram depicting a method 400 for generating broadband radiation 118, in accordance with one or more embodiments of the present disclosure. It is noted herein that the steps of method 400 may be implemented all or in part by LSP radiation source 100. It is further recognized, however, that the method 400 is not limited to the LSP radiation source 100 in that additional or alternative system-level embodiments may carry out all or part of the steps of method 400.

In step 402, a stream of target material 104 is delivered through a plasma-forming region of a chamber 106. In one embodiment, the target material source 102 introduces one or more target materials 104 into the chamber 106 in the form of a liquid jet, liquid droplets, a frozen jet, frozen droplets, or a combination of these target material forms. For example, the target material source 102 may deliver one or more of argon, xenon, neon, or helium in one or more of a solid or liquid state into the chamber 106 to generate and/or sustain a plasma. For instance, the target material source 102 may be configured to deliver the stream of target material at a speed between 10 and 300 m/s through the plasma-forming region. By way of another instance, the target material source 102 may be configured to deliver a stream of target material that has a diameter between 10 and 2000 μm through the plasma-forming region.

In step 404, debris is collected by a debris collector. For example, plasma-forming target material 104 from step 402 not consumed by the plasma 116 is collected by a debris collector 124. In one embodiment, the stream delivery parameters are adjusted such that either all material delivered by the target material source 102 evaporates in the plasma region or some of the material passes through the plasma and is collected by the debris collector 124. It is noted herein that adjustment of stream delivery parameters may promote stable plasma 116 generation and generate broadband radiation 118 with one or more substantially constant properties.

In step 406, the pump source 108 generates pump radiation 112. In one embodiment, the pump source 108 generates pump radiation 112 focused by pump laser focusing optics 110 into the chamber 106. For example, the pump source 108 may include one or more lasers to generate pump radiation 112 directed into the chamber 106. By way of another example, one or more non-laser sources may generate pump radiation 112 directed into the chamber 106.

In step 408, pump radiation 112 is focused into the plasma-forming region of the chamber 106 to generate broadband radiation 118 via formation of a plasma 116 by excitation of the target material 104 within the plasma-forming region of the chamber 106. For example, a pump source 108 may direct pump radiation 112 into a chamber 106 to generate a plasma 116. In another embodiment, the LSP radiation source 100 generates radiation including, but not limited to, broadband radiation 118. For example, the LSP radiation source 100 may generate broadband radiation 118 in the range of vacuum ultraviolet (VUV) (100-190 nm) and deep ultraviolet (DUV) (190-260 nm). It is noted herein that the chamber 106 may include one or more additional ignition sources (e.g., electrodes) configured to initiate and/or maintain the plasma 116.

In step 410, a portion of the broadband radiation 118 from the plasma 116 is collected and delivered to one or more optical elements external to the chamber 106 at a collection location 128 through a windowless aperture 122 in a wall of the chamber 106. For example, broadband radiation 118 generated by plasma 116 in the chamber 106 may be collected by collection optics 120 and directed through aperture 122 to collection location 128 where external optical elements receive the broadband radiation 118.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

Embodiments of the present disclosure are directed to a buoyancy-driven closed recirculation gas loop for facilitating fast gas flow through in an LSP radiation source. Advantageously, the LSP radiation source 100 of the present disclosure may include fewer mechanically actuated components than do previous approaches. Thus, the LSP radiation source 100 of the present disclosure may produce less noise, require smaller volumes of gas, and require lower maintenance costs and safety management.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

The invention claimed is:

1. An apparatus comprising:
   a chamber configured to contain a volume of buffer gas;
   a target material source positioned on a first side of the chamber;
   a debris collector positioned on a second side of the chamber opposite the target material source,
   wherein the target material source is configured to deliver a stream of target material through a plasma-forming region of the chamber, wherein the debris collector is configured to collect target material;
   a pump source configured to deliver pump radiation to the plasma-forming region of the chamber, wherein the pump radiation is sufficient to generate broadband radiation via formation of a plasma by excitation of the target material within the plasma-forming region of the chamber;
   one or more focusing optical elements configured to focus the pump radiation into the plasma-forming region; and one or more reflective collection optical elements configured to collect a portion of the broadband radiation from the plasma and deliver the portion of the broadband radiation to one or more optical elements external to the chamber through an aperture in a wall of the chamber, wherein the pump source, the one or more focusing optical elements and the reflective collection optical elements are arranged such that the broadband radiation has a numerical aperture higher than the NA of the pump radiation.

2. The apparatus of claim 1, wherein the broadband radiation comprises:
at least one of vacuum ultraviolet (VUV) or deep ultraviolet (DUV) radiation.

3. The apparatus of claim 1, wherein the aperture in the wall of the chamber is windowless.

4. The apparatus of claim 1, wherein the stream of target material comprises:
at least one of a stream of liquid target material, a stream of solid target material, or a series of droplets of the target material.

5. The apparatus of claim 1, wherein the target material source is configured to deliver the stream of target material at a speed between 10 and 300 m/s.

6. The apparatus of claim 1, wherein the stream of target material has a diameter between 10 and 2000 μm.

7. The apparatus of claim 1, wherein the target material comprises:
at least one of argon, xenon, neon, or helium.

8. The apparatus of claim 7, wherein the target material comprises:
a mixture containing at least one of argon, xenon, neon, or helium.

9. The apparatus of claim 1, wherein the buffer gas comprises:
an inert gas.

10. The apparatus of claim 1, wherein the buffer gas is the same as the target material.

11. The apparatus of claim 1, wherein the buffer gas is different from the target material.

12. The apparatus of claim 1, wherein the chamber is configured to contain the gas at a pressure between 0.1 and 2.0 atm.

13. The apparatus of claim 1, wherein the pump source comprises:
at least one of a continuous-wave (CW) laser, a pulsed laser, or a modulated CW laser.

14. The apparatus of claim 13, wherein the pump source is configured to generate pump radiation with pulse spacing of 100 to 1000 nanoseconds.

15. The apparatus of claim 13, wherein the pump source is configured to generate pump radiation at a power between 3 and 100 kW.

16. The apparatus of claim 13, wherein the pump source is configured to generate pump radiation having a peak laser intensity of greater than $10^5$ W/cm2.

17. A system comprising:
a broadband source comprising:
a chamber configured to contain a volume of inert gas;
a target material source positioned on a first side of the chamber;
a debris collector positioned on a second side of the chamber opposite the target material source,
wherein the target material source is configured to deliver a stream of target material through a plasma-forming region of the chamber, wherein the debris collector is configured to collect target material,
a pump source configured to deliver pump radiation to the plasma-forming region of the chamber, wherein the pump radiation is sufficient to generate broadband radiation via formation of a plasma by excitation of the target material within the plasma-forming region of the chamber;
one or more focusing optical elements configured to focus the pump radiation into the plasma-forming region; and
one or more reflective collection optical elements configured to collect a portion of the broadband radiation from the plasma and deliver the portion of the broadband radiation to one or more optical elements external to the chamber through an aperture in a wall of the chamber;
a set of illuminator optics configured to direct the broadband radiation from the one or more reflective collection optics to one or more specimens;
a detector; and
a set of projection optics configured to receive illumination from the surface of the one or more specimens and direct the illumination from the one or more specimens to the detector, wherein the pump source, the one or more focusing optical elements and the reflective collection optical elements are arranged such that the broadband radiation has a numerical aperture higher than the NA of the pump radiation.

18. The apparatus of claim 17, wherein the broadband radiation comprises:
at least one of vacuum ultraviolet (VUV) or deep ultraviolet (DUV) radiation.

19. The apparatus of claim 17, wherein the aperture in the wall of the chamber is windowless.

20. A method comprising:
delivering a stream of target material through a plasma-forming region of a gas chamber;
collecting debris from the plasma-forming region;
generating pump radiation;
focusing the pump radiation into the plasma-forming region of the chamber to generate broadband radiation via formation of a plasma by excitation of the target material within the plasma-forming region of the chamber; and
collecting a portion of the broadband radiation from the plasma and delivering the portion of the broadband radiation to one or more optical elements external to the chamber through a windowless aperture in a wall of the chamber, wherein the broadband radiation has a numerical aperture higher than the NA of the pump radiation.

21. An apparatus comprising:
a chamber configured to contain a volume of buffer gas;
a target material source positioned on a first side of the chamber;
a debris collector positioned on a second side of the chamber opposite the target material source,
wherein the target material source is configured to deliver a stream of target material through a plasma-forming region of the chamber, wherein the debris collector is configured to collect target material;
a pump source configured to deliver pump radiation to the plasma-forming region of the chamber, wherein the pump radiation is sufficient to generate broadband radiation via formation of a plasma by excitation of the target material within the plasma-forming region of the chamber;

one or more focusing optical elements configured to focus the pump radiation into the plasma-forming region; and
one or more reflective collection optical elements configured to collect a portion of the broadband radiation from the plasma and deliver the portion of the broadband radiation to one or more optical elements external to the chamber through an aperture in a wall of the chamber, wherein the pump source, the one or more focusing optical elements and the reflective collection optical elements are arranged such that the broadband radiation has a numerical aperture lower than the NA of the pump radiation.

22. The apparatus of claim 21, wherein the broadband radiation comprises:
at least one of vacuum ultraviolet (VUV) or deep ultraviolet (DUV) radiation.

23. The apparatus of claim 21, wherein the pump source, the one or more focusing optical elements and the reflective collection optical elements are arranged such that the broadband radiation has a numerical aperture higher than the NA of the pump radiation.

24. The apparatus of claim 21, wherein the pump source, the one or more focusing optical elements and the reflective collection optical elements are arranged such that the broadband radiation has a numerical aperture lower than the NA of the pump radiation.

25. The apparatus of claim 21, wherein the aperture in the wall of the chamber is windowless.

26. The apparatus of claim 21, wherein the stream of target material comprises:
at least one of a stream of liquid target material, a stream of solid target material, or a series of droplets of the target material.

27. e apparatus of claim 21, wherein the target material source is configured to deliver the stream of target material at a speed between 10 and 300 m/s.

28. The apparatus of claim 21, wherein the stream of target material has a diameter between 10 and 2000 μm.

29. The apparatus of claim 21, wherein the target material comprises:
at least one of argon, xenon, neon, or helium.

30. The apparatus of claim 29, wherein the target material comprises:
a mixture containing at least one of argon, xenon, neon, or helium.

31. The apparatus of claim 21, wherein the buffer gas comprises:
an inert gas.

32. The apparatus of claim 21, wherein the buffer gas is the same as the target material.

33. The apparatus of claim 21, wherein the buffer gas is different from the target material.

34. The apparatus of claim 21, wherein the chamber is configured to contain the gas at a pressure between 0.1 and 2.0 atm.

35. The apparatus of claim 21, wherein the pump source comprises:
at least one of a continuous-wave (CW) laser, a pulsed laser, or a modulated CW laser.

36. The apparatus of claim 35, wherein the pump source is configured to generate pump radiation with pulse spacing of 100 to 1000 nanoseconds.

37. The apparatus of claim 35, wherein the pump source is configured to generate pump radiation at a power between 3 and 100 kW.

38. The apparatus of claim 35, wherein the pump source is configured to generate pump radiation having a peak laser intensity of greater than $10^5$ W/cm2.

39. A system comprising:
a broadband source comprising:
a chamber configured to contain a volume of inert gas;
a target material source positioned on a first side of the chamber;
a debris collector positioned on a second side of the chamber opposite the target material source,
wherein the target material source is configured to deliver a stream of target material through a plasma-forming region of the chamber, wherein the debris collector is configured to collect target material,
a pump source configured to deliver pump radiation to the plasma-forming region of the chamber, wherein the pump radiation is sufficient to generate broadband radiation via formation of a plasma by excitation of the target material within the plasma-forming region of the chamber;
one or more focusing optical elements configured to focus the pump radiation into the plasma-forming region; and
one or more reflective collection optical elements configured to collect a portion of the broadband radiation from the plasma and deliver the portion of the broadband radiation to one or more optical elements external to the chamber through an aperture in a wall of the chamber;
a set of illuminator optics configured to direct the broadband radiation from the one or more reflective collection optics to one or more specimens;
a detector; and
a set of projection optics configured to receive illumination from the surface of the one or more specimens and direct the illumination from the one or more specimens to the detector, wherein the pump source, the one or more focusing optical elements and the reflective collection optical elements are arranged such that the broadband radiation has a numerical aperture lower than the NA of the pump radiation.

40. The apparatus of claim 39, wherein the broadband radiation comprises:
at least one of vacuum ultraviolet (VUV) or deep ultraviolet (DUV) radiation.

41. The apparatus of claim 39, wherein the pump source, the one or more focusing optical elements and the reflective collection optical elements are arranged such that the broadband radiation has a numerical aperture higher than the NA of the pump radiation.

42. The apparatus of claim 39, wherein the pump source, the one or more focusing optical elements and the reflective collection optical elements are arranged such that the broadband radiation has a numerical aperture lower than the NA of the pump radiation.

43. The apparatus of claim 39, wherein the aperture in the wall of the chamber is windowless.

44. A method comprising:
delivering a stream of target material through a plasma-forming region of a gas chamber;
collecting debris from the plasma-forming region;
generating pump radiation;
focusing the pump radiation into the plasma-forming region of the chamber to generate broadband radiation via formation of a plasma by excitation of the target material within the plasma-forming region of the chamber; and collecting a portion of the broadband radiation from the plasma and delivering the portion of the broadband radiation to one or more optical elements external to the chamber through a windowless aperture in a wall of the chamber, wherein the broadband radiation has a numerical aperture lower than the NA of the pump radiation.

* * * * *

UNITED STATES PATENT AND TRADEMARK OFFICE
CERTIFICATE OF CORRECTION

PATENT NO. : 10,806,016 B2
APPLICATION NO. : 16/036660
DATED : October 13, 2020
INVENTOR(S) : Oleg Khodykin et al.

Page 1 of 1

It is certified that error appears in the above-identified patent and that said Letters Patent is hereby corrected as shown below:

In the Claims

Column 15, Line 54, Claim 16 should read:
--intensity of greater than $10^5 W/cm^2$.--

Column 15, Line 57, Claim 17 should read:
--An apparatus comprising:--

Column 18, Line 3, Claim 38 should read:
--intensity of greater than $10^5 W/cm^2$.--

Column 18, Line 4, Claim 39 should read:
--An apparatus comprising:--

Signed and Sealed this
First Day of December, 2020

Andrei Iancu
*Director of the United States Patent and Trademark Office*